United States Patent
Zhao

(10) Patent No.: US 10,230,352 B2
(45) Date of Patent: *Mar. 12, 2019

(54) RATE CONVERTOR

(71) Applicant: Avnera Corporation, Beaverton, OR (US)

(72) Inventor: Xudong Zhao, Portland, OR (US)

(73) Assignee: AVNERA CORPORATION, Beaverton, OR (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/786,500

(22) Filed: Oct. 17, 2017

(65) Prior Publication Data

US 2018/0041196 A1 Feb. 8, 2018

Related U.S. Application Data

(63) Continuation of application No. 14/857,681, filed on Sep. 17, 2015, now Pat. No. 9,793,879.

(Continued)

(51) Int. Cl.

| | |
|---|---|
| *G10L 21/00* | (2013.01) |
| *G10L 19/00* | (2013.01) |
| *H03M 13/33* | (2006.01) |
| *H03M 13/00* | (2006.01) |
| *H03M 13/27* | (2006.01) |
| *H03H 17/06* | (2006.01) |
| *G10L 21/0316* | (2013.01) |
| *H03M 7/00* | (2006.01) |
| *H03M 5/00* | (2006.01) |
| *G10L 21/0356* | (2013.01) |

(Continued)

(52) U.S. Cl.
CPC ..... *H03H 17/0628* (2013.01); *G10L 21/0316* (2013.01); *G10L 21/0356* (2013.01); *H03H 17/028* (2013.01); *H03M 5/00* (2013.01); *H03M 7/00* (2013.01); *H03M 13/00* (2013.01); *H03M 13/27* (2013.01); *H03M 13/33* (2013.01); *G10L 19/00* (2013.01); *G10L 19/24* (2013.01); *G10L 2019/001* (2013.01)

(58) Field of Classification Search
CPC ........ G10L 21/00; G10L 19/00; H03M 13/33; H03M 13/00; H03M 13/27
USPC .................... 704/204, 500; 375/354, 376
See application file for complete search history.

(56) References Cited

U.S. PATENT DOCUMENTS

| | | | | |
|---|---|---|---|---|
| 4,989,221 | A | * | 1/1991 | Qureshi ............. H03H 17/0621 370/290 |
| 5,388,127 | A | * | 2/1995 | Scarpa .................... H04L 7/027 375/327 |

(Continued)

*Primary Examiner* — Seong Ah A Shin
(74) *Attorney, Agent, or Firm* — Miller Nash Graham & Dunn LLP

(57) ABSTRACT

Embodiments of the invention may be used to implement a rate converter that includes: 6 channels in forward (audio) path, each channel having a 24-bit signal path per channel, an End-to-end SNR of 110 dB, all within the 20 Hz to 20 KHz bandwidth. Embodiment may also be used to implement a rate converter having: 2 channels in a reverse path, such as for voice signals, 16-bit signal path per channel, an End-to-end SNR of 93 dB, all within 20 Hz to 20 KHz bandwidth. The rate converter may include sample rates such as 8, 11.025, 12, 16, 22.05, 24, 32 44.1, 48, and 96 KHz. Further, rate converters according to embodiments may include a gated clock in low-power mode to conserve power.

18 Claims, 14 Drawing Sheets

Related U.S. Application Data

(60) Provisional application No. 62/051,599, filed on Sep. 17, 2014.

(51) Int. Cl.
*H03H 17/02* (2006.01)
*G10L 19/24* (2013.01)

(56) References Cited

U.S. PATENT DOCUMENTS

| | | | | |
|---|---|---|---|---|
| 5,425,060 A * | 6/1995 | Roberts | .......... | H04L 7/027 375/371 |
| 5,434,884 A * | 7/1995 | Rushing | .......... | H04L 27/3872 375/235 |
| 5,459,432 A * | 10/1995 | White | .......... | G01C 19/5607 329/307 |
| 6,259,389 B1 * | 7/2001 | McGrath | .......... | G06F 17/5036 341/118 |
| 6,535,565 B1 * | 3/2003 | Girardeau, Jr. | .......... | G06F 1/12 327/144 |
| 6,711,228 B1 * | 3/2004 | Kato | .......... | G11B 20/10037 327/159 |
| 7,042,925 B2 * | 5/2006 | Shiue | .......... | H03G 3/3052 370/509 |
| 7,340,024 B1 * | 3/2008 | Nelson | .......... | H03H 17/028 375/293 |
| 2001/0033583 A1 * | 10/2001 | Rabenko | .......... | H04B 3/23 370/503 |
| 2002/0186713 A1 * | 12/2002 | Brunel | .......... | H03L 7/23 370/480 |
| 2003/0043947 A1 * | 3/2003 | Zehavi | .......... | H04B 1/7156 375/365 |
| 2004/0101143 A1 * | 5/2004 | Avalos | .......... | H04B 1/1646 381/2 |
| 2004/0120361 A1 * | 6/2004 | Yu | .......... | H03H 17/0628 370/545 |
| 2004/0190649 A1 * | 9/2004 | Endres | .......... | H03G 3/3052 375/326 |
| 2004/0196915 A1 * | 10/2004 | Gupta | .......... | H04L 27/266 375/260 |
| 2005/0096879 A1 * | 5/2005 | Waite | .......... | G01V 3/12 702/189 |
| 2006/0221936 A1 * | 10/2006 | Rauchwerk | .......... | H04J 3/0632 370/352 |
| 2007/0014385 A1 * | 1/2007 | Shiraishi | .......... | G11B 20/10009 375/341 |
| 2007/0025397 A1 * | 2/2007 | Sticht | .......... | H04J 3/076 370/503 |
| 2007/0058708 A1 * | 3/2007 | Bultan | .......... | H03J 7/04 375/226 |
| 2008/0069283 A1 * | 3/2008 | Casorso | .......... | G11B 20/10037 375/376 |
| 2008/0315928 A1 * | 12/2008 | Waheed | .......... | G04F 10/005 327/159 |
| 2008/0315960 A1 * | 12/2008 | Waheed | .......... | G04F 10/005 331/17 |
| 2012/0087225 A1 * | 4/2012 | Honma | .......... | G11B 20/10046 369/59.19 |
| 2014/0043177 A1 * | 2/2014 | Pagnanelli | .......... | H03M 3/30 341/143 |
| 2016/0140983 A1 * | 5/2016 | Zhao | .......... | H03H 17/028 704/205 |

* cited by examiner

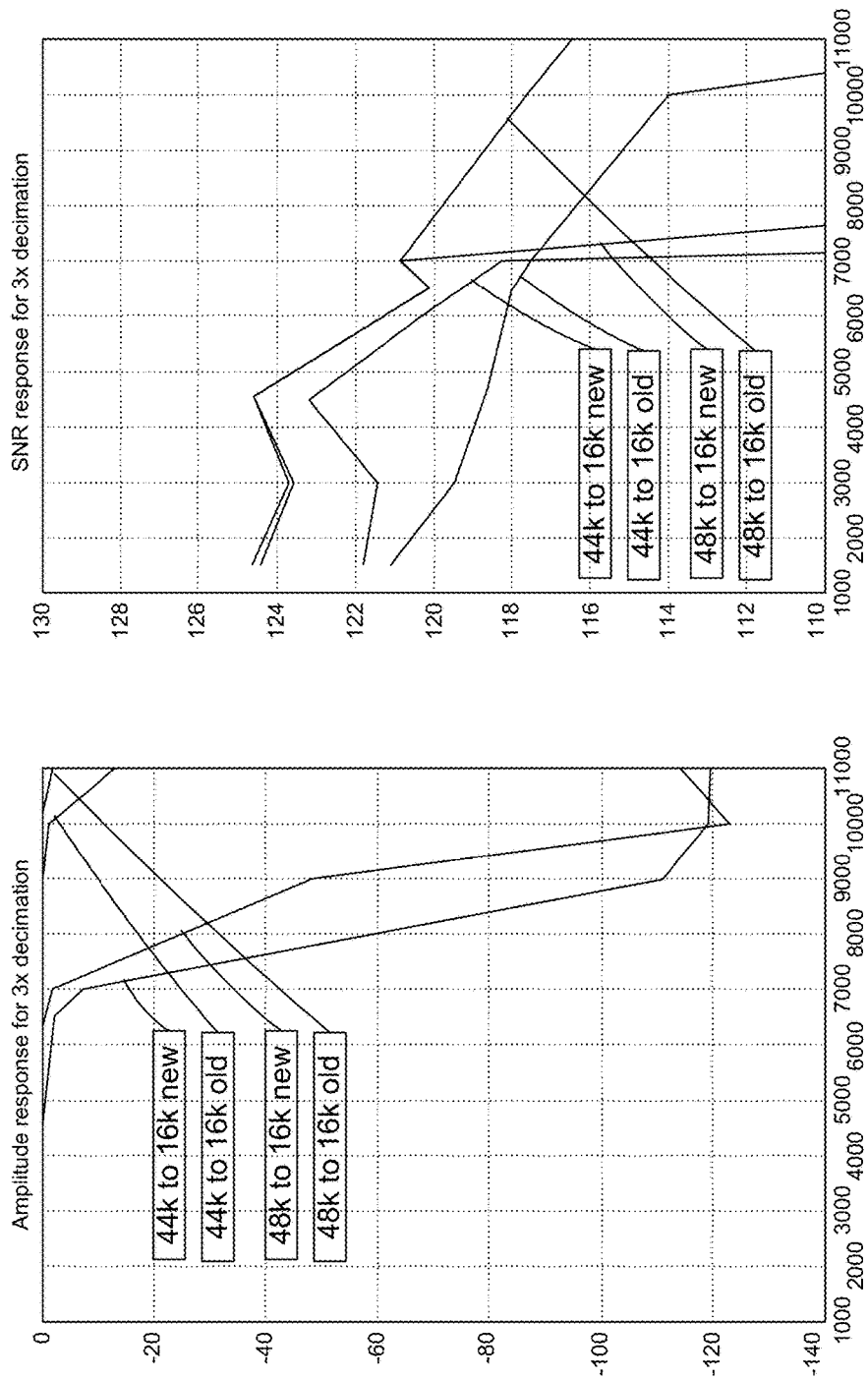

RATE CONVERTOR

CROSS REFERENCE TO RELATED APPLICATIONS

This application is a continuation of co-pending U.S. non-provisional application Ser. No. 14/857,681, filed Sep. 17, 2015, entitled RATE CONVERTOR, which claims benefit of U.S. provisional application No. 62/051,599, filed Sep. 17, 2014, entitled RATE CONVERTOR, the contents of both of which are incorporated herein by reference.

FIELD OF THE INVENTION

This disclosure is directed to signal processing, and, more specifically, to a system for converting data samples at a first rate to data samples at a second rate.

BACKGROUND

In general, conventional rate converters include two major computation blocks, as illustrated in FIG. 1. A first block is a conversion rate tracking loop that determines the ratio between an input sample rate and output sample rate. Once the ratio is determined, the conversion rate tracking loop generates the corresponding input sample index for each output sample.

The second computation block is the sample interpolator. The function of this block is to interpolate the input data sample and to generate the output data sample with the real value index. One problem with conventional rate converters is that they create aliasing from the resampling, and it is relatively difficult to produce an output signal having a high Signal-to-Noise Ratio (SNR) and having a relatively flat frequency response within standard frequency ranges for audio signals.

Embodiments of the invention address this and other limitations of the prior art.

SUMMARY OF THE INVENTION

Embodiments of the invention may be used to implement a rate converter that includes: 6 channels in forward (audio) path, each channel having a 24-bit signal path per channel, an End-to-end SNR of 110 dB, all within the 20 Hz to 20 KHz bandwidth. Embodiment may also be used to implement a rate converter having: 2 channels in a reverse path, such as for voice signals, 16-bit signal path per channel, an End-to-end SNR of 93 dB, all within 20 Hz to 20 KHz bandwidth.

The rate converter may include sample rates such as 8, 11.025, 12, 16, 22.05, 24, 32 44.1, 48, and 96 KHz.

Further, rate converters according to embodiments may include a gated clock in low-power mode to conserve power.

BRIEF DESCRIPTION OF THE DRAWINGS

FIGS. 8A-8B, 9A-9B, 10A-10B, 11A-11B, 12A-12B, 13A-13B, 14A-14B, are graphs illustrating performance differences between an old rate convertor and an example rate convertor according to embodiments of the invention.

DETAILED DESCRIPTION

Figure 1:
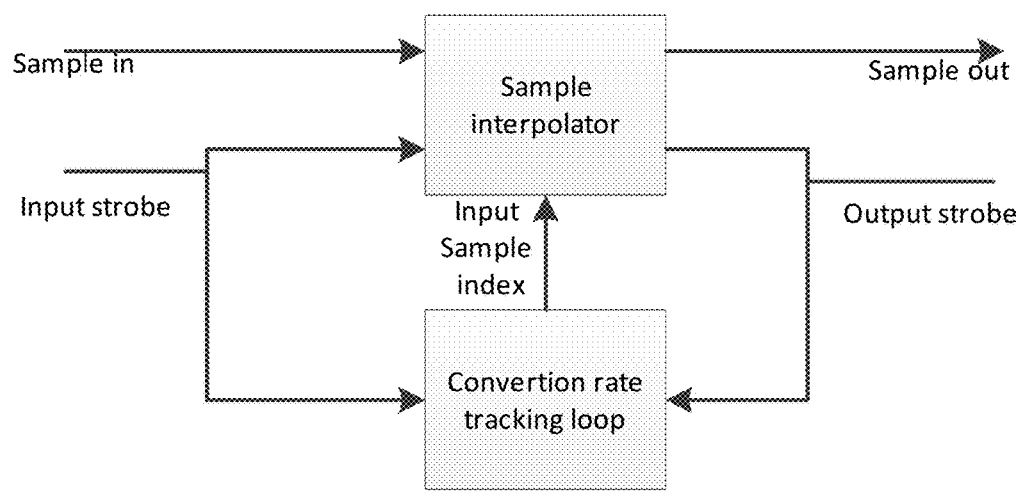
FIG. 1 is a block diagram of a conventional rate converter.
Figure 2:
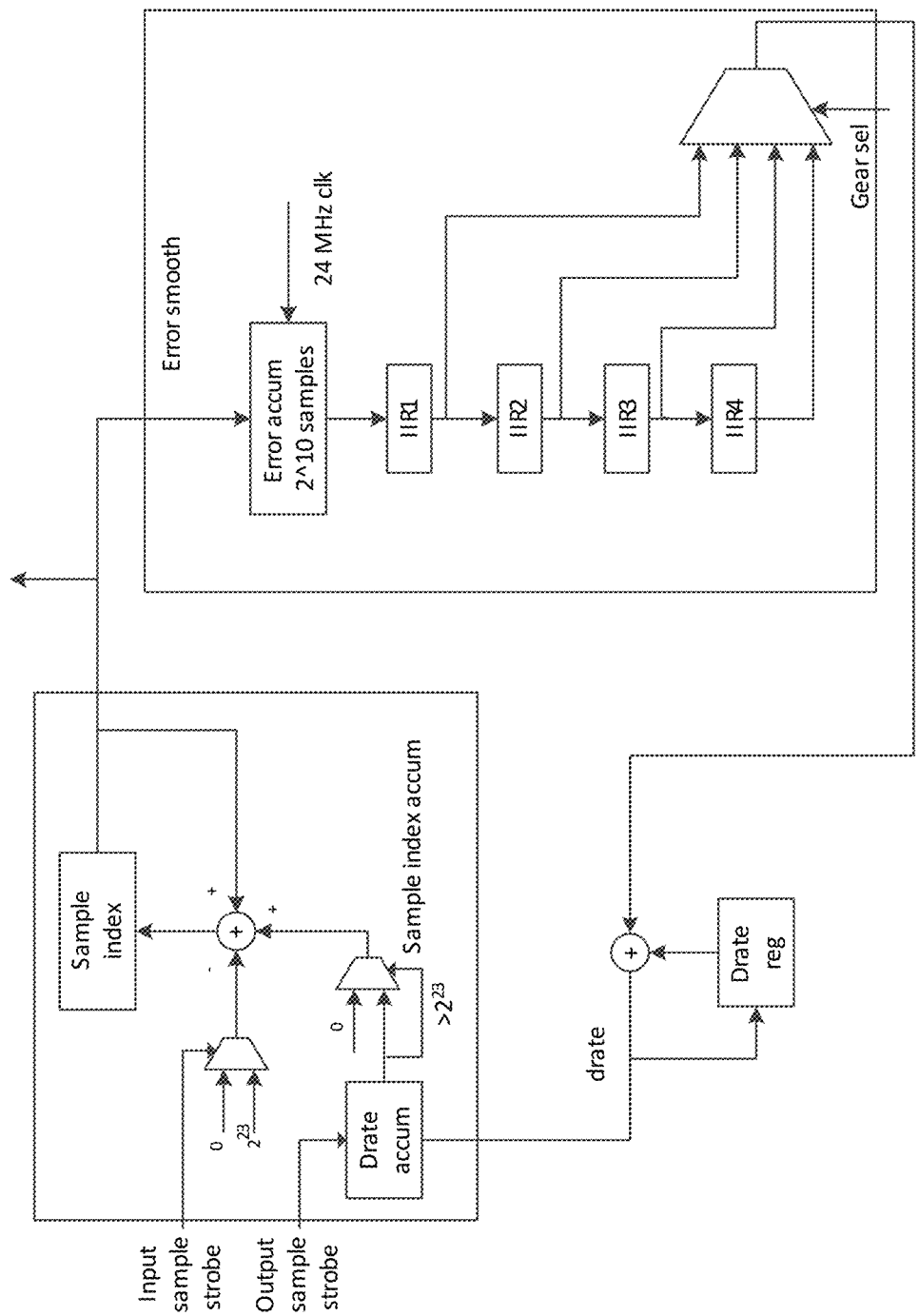
FIG. 2 is a block diagram for a conversion rate tracking loop of a first type of rate converter.
Figure 3:
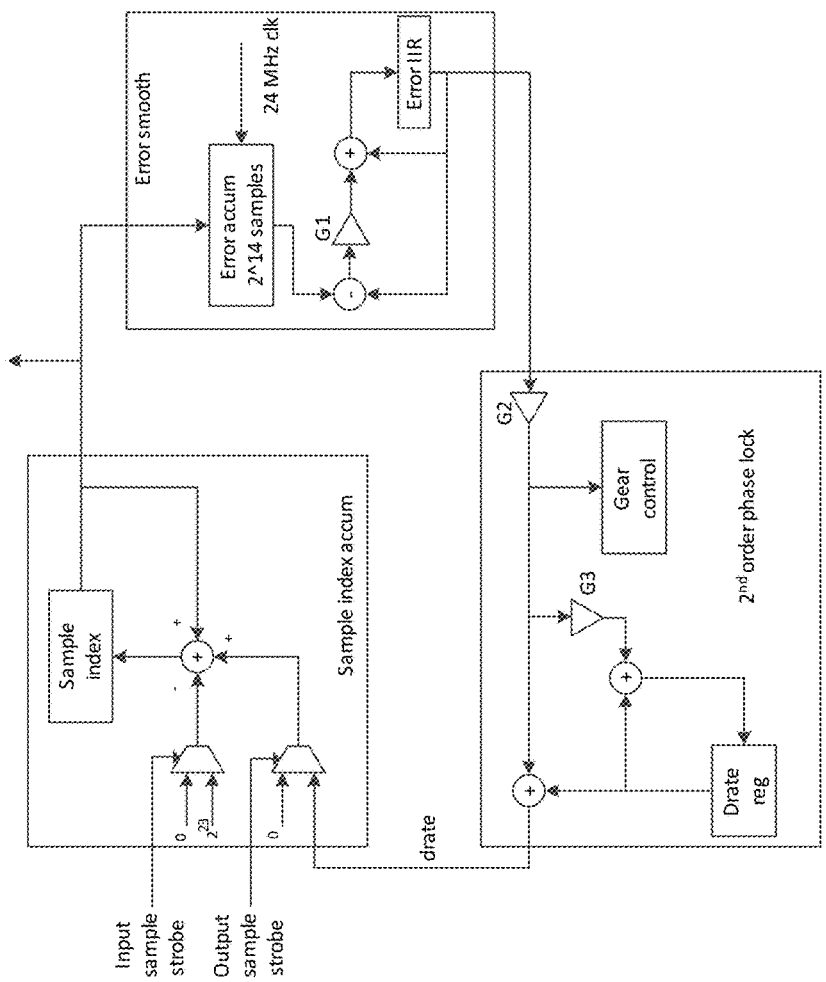
FIG. 3 is a block diagram for a conversion rate tracking loop of a rate converter according to embodiments of the invention.

For comparison, FIG. 2 is a block diagram for a conversion rate tracking loop of a first type of rate converter, while FIG. 3 is a block diagram for a conversion rate tracking loop of a rate converter according to embodiments of the invention.

In general, with reference to FIG. 3, inputs for a rate converter block include an input audio sample, an input audio channel id, a signal that the input sample is ready, and a signal that indicates that the audio destination is ready to take the next sample. In particular, the input audio samples are packed into one word for all the audio channels, which is time multiplexed for all channels. The input audio channel id tells which channel the sample belongs to. The input sample ready signal signifies that the next audio sample is ready, while the output sample acknowledgement signifies that the audio destination is ready to take the next sample. Other standard interfaces signals like clk, reset, enable, etc. may be present, as well as one or more control signals from a Direct Memory Address. Finally, there may be one or more register bank access signals.

There are also several output signals. An output audio sample includes a single word with all of the audio channels output from the converter. It is time multiplexed for all channels. The output audio channel id tells which channel the sample belongs to. An output sample ready signal signifies that the next audio sample is ready. An input sample ack signifies that the converter is ready to accept the next signal from the audio source. Also, a register bank access signal may be output.

In general, with reference to FIG. 3, the rate tracking loop tries to estimate the ratio between an input sample rate and output sample rate. In addition, it generates the input sample index that corresponds to every output sample.

Both input and output sample rates may be jittery. The estimated sample rate ratio should be stable enough to yield a high SNR, and also should maintain a stable average value for the sample index. Ideally, for maximum performance input buffers should not overflow or underflow, and audio latency variation should be minimized.

In operation, initially, an estimate of drate (decimation rate) is obtained by either a user setting, or by measuring input and out sample rates. The estimated value is stored in drate reg, which is a register that stores the decimation rate.

The tracking loop circuit includes one or more different "gears." In one embodiment there are four gears. The difference between the gears is the value for the gain elements G1, G2 and G3. The gain values for each of the gear levels are programmed in registers and can be changed by firmware. The gear control decides when to move the gear up or down. The change is controlled by two factors. In some embodiments, the converter stays in each gear for a minimal amount of time before switching to another gear. Also in some embodiments, this minimal time doubles for each higher gear. In one embodiment, the rate converter of FIG. 3 moves to a higher gear when the absolute value of error and the change slope of error are both under certain thresholds. Likewise, if the absolute value of error or the change slope is above the thresholds, the tracking loop would move down the gear.

Table 1 includes default values for tracking loop parameter registers according to embodiments of the invention

TABLE 1

| Gear | 0 | 1 | 2 | 3 |
|---|---|---|---|---|
| $Log_2(G1)$ | −3 | −5 | −7 | −9 |
| $Log_2(G2)$ | −7 | −9 | −11 | −13 |
| $Log_2(G3)$ | −6 | −8 | −10 | −12 |
| $Log_2$(gear up abs) | 9.5 | 7.5 | 5.5 | N/A |
| $Log_2$(gear up slope) | 8 | 6 | 4 | N/A |
| $Log_2$(gear down abs) | N/A | 10.5 | 8.5 | 6.5 |
| $Log_2$(gear down slope) | N/A | 9 | 7 | 5 |

The tracking loop of FIG. 3 converges with the default values. In some embodiment it converges within 1 second before the SNR is above 100 dB, and reaches final lock with the next few seconds. The final tracking yields a latency variation of less than 100 ns. The overall SNR impact is also small. More than 120 dB SNR can be reached.

In a particular implementation of embodiments of the invention, the index error is sampled at 24 MHz to get time accuracy that is way below the sample period. The average by $2^{14}$ enables all of 2nd order phase lock loop and the IIR in error smoothing to operate at 1.5 KHz clock, which allows a very low current draw. The sample index buffer has 28 bits. With one input sample counts as $2^{23}$, that gives enough room for 16 samples. Since the input buffer is only 16 samples more than the filter requirement. It is enough to cover all possible cases. The drate register contains 41 bits. That is 13 more LSB than the sample index buffer. The 13 LSBs may be a conservative number, but it costs very little in area and current. The error IIR buffer contains 45 bits. It adds 13 LSBs to the input from index error average. Again, 13 LSBs may be a conservative number, but it costs very little in area and current since no multipliers are required. The operation frequency is 1.5 KHz. Dithering is done at reducing drate from 41 bit to 28 bit before adds to sample buffer.

Compared to the rate converter illustrated in FIG. 2, the rate converter of FIG. 3 is much more efficient. The rate converter of FIG. 3 includes a simple 1st order IIR filter, while the converter of FIG. 2 has four more complex low pass filters. The simple 1st order IIR filter is certainly much simpler and costs a lot less area and current. Each filter has different gain and different spectral/impulse response. All four filters are running all the time. The gear shift decides which filter result to pick. The average is over $2^{10}$ samples instead of $2^{14}$.

In one embodiment, the gear selection of the new rate converter depends only on time. For each gear level, it stays for a fixed amount time. The stay time for gear level n+1 is twice as the time for level n. The time to stay in each gear depends on the phase lock quality. Different initial conditions and sample conversion ratios decides how long to stay. A threshold based decision is a good implementation method.

There is no 2nd order tracking loop. Instead, the drate output is dumped into the register four times during the operation of the rate converter.

The first time is at beginning of rate conversion and it is set to the initially estimated drate.

Each time gear changes up, the current drate is dumped into a register.

The sample index buffer is not adjusted for every output sample, but instead it is adjusted when the accumulative increase is above one input sample.

Introducing the 2nd order tracking loop is the biggest change for performance compared to the converter of FIG. 2. The converter of FIG. 2 always converges, but when it converges, the sample index is not 0. That causes some variance in audio latency. If the data is dumped too often, it causes divergence. If the amount of change is reduced each time, then it becomes a 2nd order tracking loop. If it is updated every time the IIR gets a new value, it behaves as the 2nd order tracking loop of FIG. 3.

The older design of FIG. 2 updates the sample index buffer every time the accumulation across the input sample, which is unnecessary complex. The design of FIG. 3 does not update according to the same schedule.

While the above description has been focused on rate tracking, embodiments of the invention additionally include a new design for the other major block of a rate converter, the sample interpolator.

Theoretical Background

In theory, the approach is to apply a continuous time filter with certain frequency response to a discretely sampled input and then discretely resample it at another sample rate.

The frequency response of such a filter should reject the alias generated by the discrete time input samples as much as possible while maintaining the audio passband as much as possible.

For implementation simplicity, embodiments of the invention use a filter length of 80 times input sample period. For example, let's suppose the filter value is f(t) for $-40T_s<t\leq40T_s$. Let the input samples be $s_n$, the output sample $s_m'=\Sigma_{k=-40}^{40}s_{\lfloor mr \rfloor+k}\cdot f((mr-\lfloor mr \rfloor+k)\cdot T_s)$ where r is the output sample to input sample ratio.

It is conventionally difficult to get the values of filter f. The filter can be pre-computed and stored, but the memory requirement is very big. To achieve 120 dB alias rejection would require more than a million entries stored, which is an impractically large number. Instead, the whole 80 sample period may be broken into many pieces and given a polynomial for each piece to approximate the continuous time filter. One embodiment includes a 3rd order polynomial over 640 time pieces. That selection provides an alias less than 120 dB lower than signal for the entire audio pass band.

The way to generate such polynomials is first generate a vastly oversampled filter with the desired frequency response and length. Then, within each of the 640 time pieces, the points of the filter are fit to a 3rd order polynomial with minimum square error. The performance of such polynomials can be verified by computing 30 points in each time piece and look at the overall frequency response.

Figure 4:
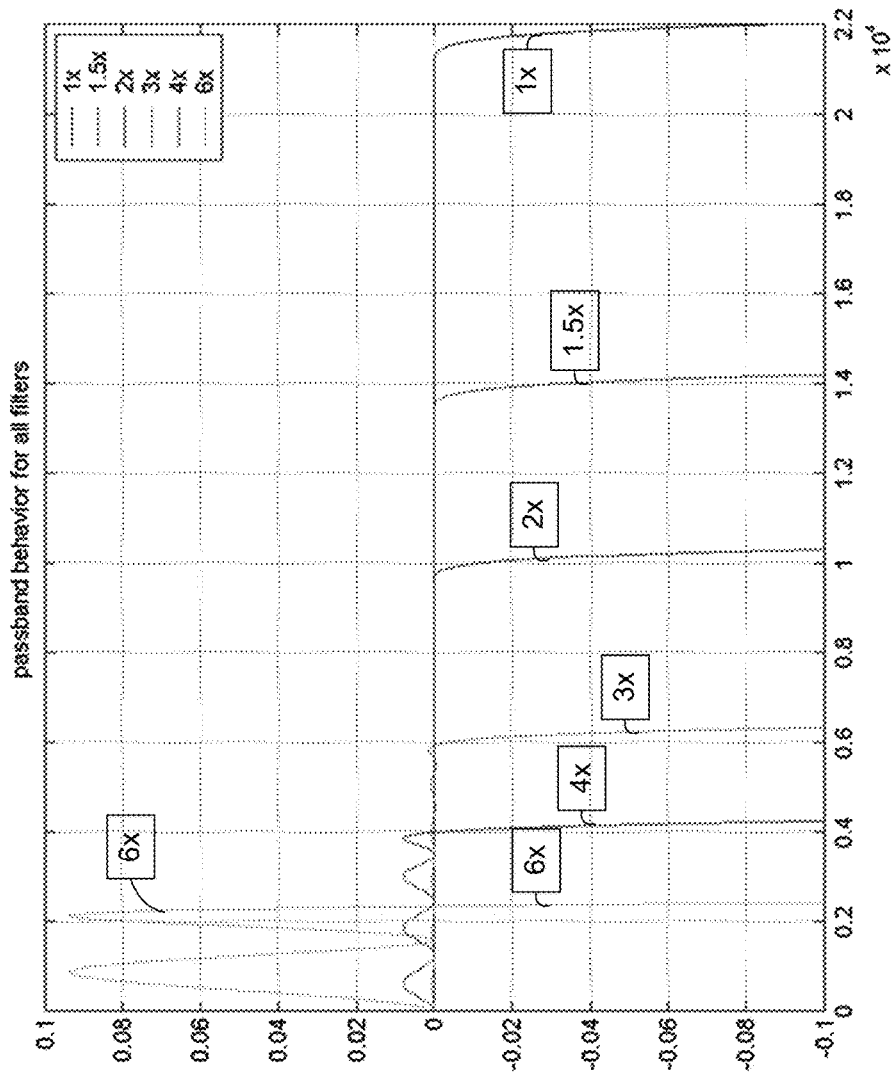
FIG. 4 is a graph showing passband behavior for anti-alias filters according to embodiments of the invention.

FIG. 4 is a graph showing passband behavior for anti-alias filters according to embodiments of the invention.

From the graph, it can be seen that the passband ripple for 6× decimation is 0.1 dB, for 4× decimation is 0.01 dB and even lower for other filters.

Figure 5:
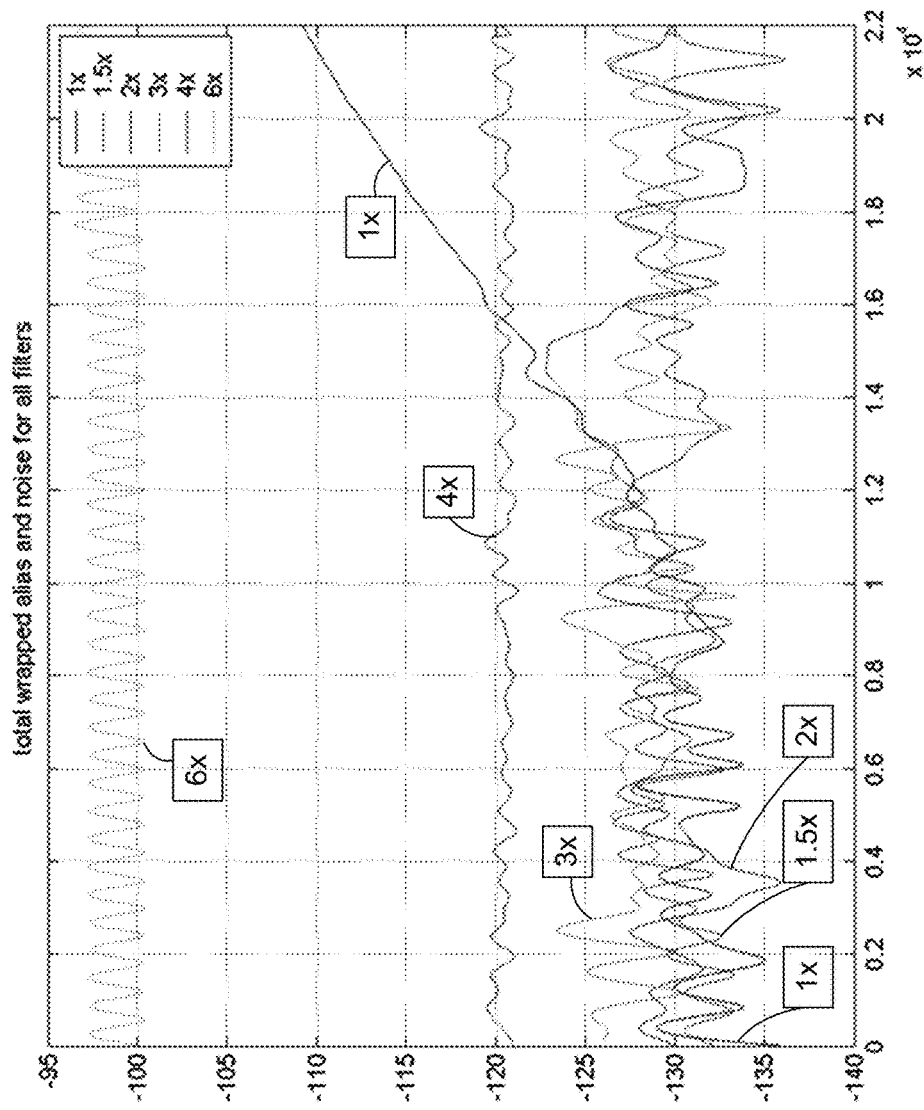
FIG. 5 is a graph illustrating total wrapped aliases for all anti-alias filters according to embodiments of the invention.
Figure 6A:
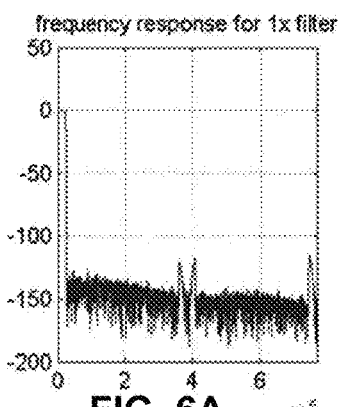
FIGS. 6A, 6B, 6C, 6D, 6E, and 6F illustrate frequency responses for 1×, 1.5×, 2×, 3×, 4×, and 6× filters according to embodiments of the invention.
Figure 6B:
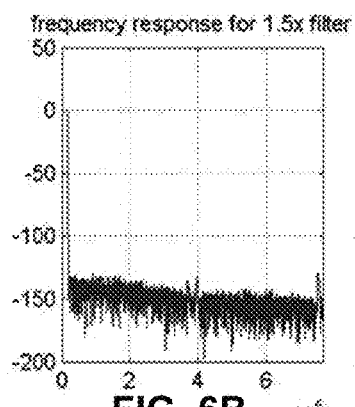
Figure 6C:
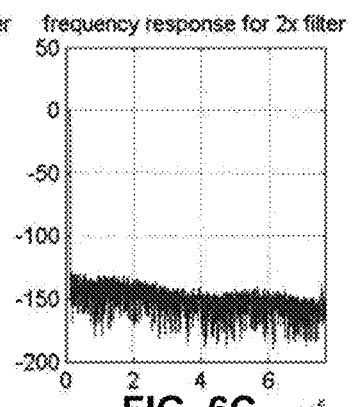
Figure 6D:
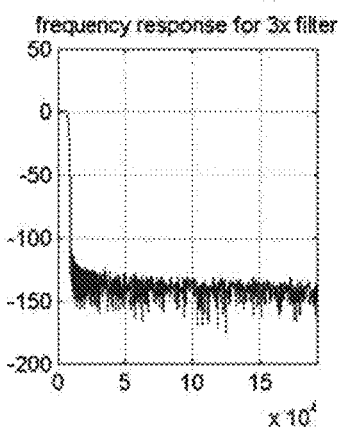
Figure 6E:
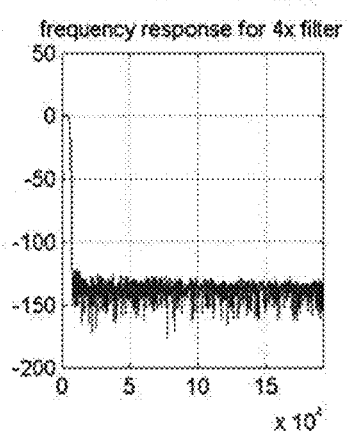
Figure 6F:
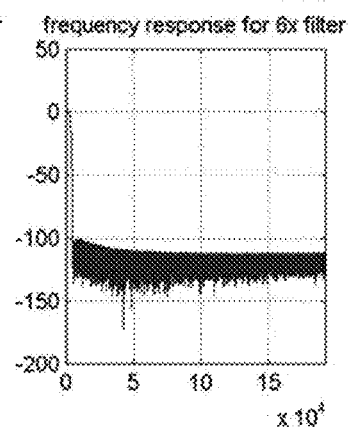

FIG. 5 is a graph illustrating total wrapped aliases for all anti-alias filters according to embodiments of the invention. This figure shows that the total alias for 6× decimation is between −97 dB to −100 dB. The total alias for 4× decimation is about 120 dB. The total alias for 1× filter is around −130 dB up to 10 KHz; then it goes up to −120 dB at 16 KHz and to −112 dB at 20 KHz.

For all other filters, the alias rejection varies between −130 dB to −125 dB. There are occasional strays going up to −122 dB.

FIGS. 6A-6E illustrate individual frequency responses for 1×, 1.5×, 2×, 3×, 4×, and 6× filters according to embodiments of the invention. The humps on the 1× filter and 1.5× filter is a result of the polynomial approximation. For the other filters, since the cutoff frequency is much lower, the polynomial approximation error is under the noise floor.

Figure 7:
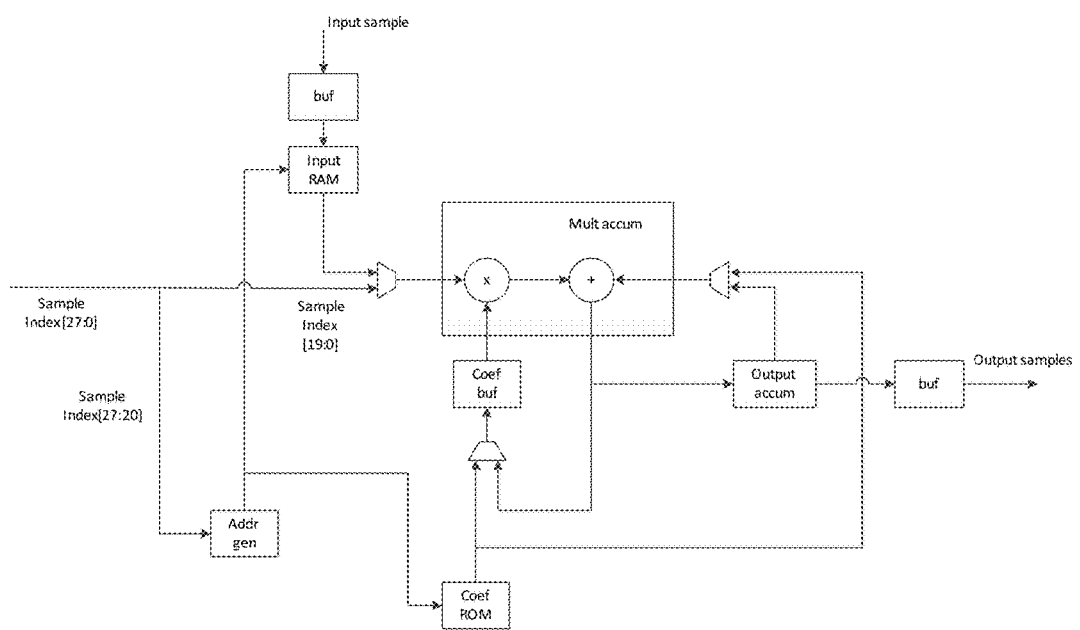
FIG. 7 is a block diagram of an interpolator portion of a rate controller according to embodiments of the invention.

FIG. 7 is a block diagram of an interpolator portion of a rate controller according to embodiments of the invention. Although not illustrated, the multiplexers (muxes) are controlled by state machine.

In operation, one operation cycle is performed on each output sample. In one embodiment, each operation cycle goes through 80 samples corresponding to the filter size. For each of the 80 samples, first is coefficient generation, and then the multiplier and adding over one input sample for each audio channel. When the whole computation is over, the output sample is stored in the 2 sample FIFO buffer.

In the following example, let N be the number of audio channels.

Each operation cycle takes (N+3)*80 cycles.
Let k be the sample index between 0 and 79.
The coefficient ROM is read in the following cycles:
For cycle k*(N+3)+1, the coef ROM reads out the 3rd order coefficient and stores it to coef buffer;
For cycle k*(N+3)+2, the coef ROM read out the 2nd order coefficient and passes it to the adder;
For cycle k*(N+3)+3, the coef ROM read out the 1st order coefficient and passes it to the adder;
For cycle k*(N+3)+4, the coef ROM read out the 0th order coefficient and passes it to the adder.

The coefficient buffer is updated during cycles k*(N+3)+1 to k*(N+3)+4. It takes input from coefficient ROM in cycle k*(N+3)+1 and takes input from multiplier accumulator in other cycles.

The input RAM is read during cycles k*(N+3)+5 to k*(N+3)+N+4. Note that the last cycle of input RAM access overlaps with first cycle of coefficient ROM access. But this does not cause any problem.

The output accumulator is reset to 0 at cycle 0 and is updated during cycles k*(N+3)+5 to k*(N+3)+N+4.

The multiplier selector takes LSB of sample index during cycles k*(N+3)+2 to k*(N+3)+4 and takes input RAM during cycles k*(N+3)+5 to k*(N+3)+N+4.

The adder selector takes coefficient buffer during cycles k*(N+3)+2 to k*(N+3)+4 and takes output accumulator during cycles k*(N+3)+5 to k*(N+3)+N+4.

Let x be the LSB of sample index. The operation being done are:
Cycle k*(N+3)+1 gets $c'=c_3$
Cycle k*(N+3)+2 gets $c'=cx+c_2=c_3x+c_2$
Cycle k*(N+3)+3 gets $c'=cx+c_1=c_3x^2+c_2x+c_1$
Cycle k*(N+3)+4 gets $c'=cx+c_0=c_3x^3+c_2x^2+c_1x+c_0$. That is the coefficient applied over all audio channels.
Cycle k*(N+3)+j, $0 \leq j < N$, gets $b_j'=b_j+c \cdot a_{j,k}$. Here $b_j$ is the output accumulator for channel j and $a_{j,k}$ is the input sample k for channel j.

At the end of (N+3)*80 cycles, the output accumulators are dumped into the output buffer and ready for output over output strobe.

Implementation Details

In an example implementation, for each filter, there are 640 time intervals. Each contains a 3rd order polynomial. Therefore, 2560 words are needed for each filter coefficient ROM. However, symmetry reduces the coefficient ROM. Since f(-t)=f(t), we only need to store half of the filter polynomials. That is, 1280 words per filter coefficient ROM.

There is one input buffer and one output buffer for each audio channel. Each input or output buffer contains two 24 bit words. It serves as a FIFO to temporally store the input or output sample before written by input RAM or output to the next block.

The input RAM contains 96 words of 24 bit width for each audio channel. In the 96 words, 80 are used for the anti-aliasing filter. The remaining 16 are used for possible sample jitter and input/output rate mismatch before the phaselock loop completely locks.

The address gen generates the access address for the input sample RAM and the coefficient ROM. Suppose the input buffer start address is i, the sample index is $a \cdot 2^{23}+b \cdot 2^{20}+c$ when an operation cycle starts. Then the kth sample index generated is (a+i+8+k)mod96. The coefficient ROM address is 32·(a+k)+4·b+j, here j means the coefficient order of the polynomial.

The multiplier is a 24 bit by 24 bit signed multiplier. The adder is a 28 bit adder. The output accumulator is 28 bits too. Rounding is performed before storing to the output sample buffer.

Compared to the operation of the interpolator that operates in conjunction with the rate tracker of FIG. 2, the major differences with the interpolator are:

The conventional multiplier is a pipelined multiplier that takes 12 cycles. The multiplier in the interpolator of FIG. 7 is a single cycle booth multiplier come from synthesizer.

In the old interpolator $x^2$ and $x^3$ must be computed because of the 12 cycle multiplier latency. In the old interpolator, the new coefficient is computes as $c_3x^3+c_2x^2+c_1x+c_0$ while the new interpolator compute it as $((c_3x+c_2)x+c_1)x+c_0$ which does not need to compute $x^2$ and $x^3$.

Each operation cycle of the old interpolator requires 92N+288 cycles and 80N+240 cycles in the interpolator of FIG. 7. That means a higher clock rate is required in the old interpolator.

The old interpolator only has two filters, one for full bandwidth and the other for half bandwidth. The new design has 6 filters, supporting 1×, 1.5×, 2×, 3×, 4×, and 6× decimation. That practically allows any rate to any rate conversion. Also, the old interpolator has 2560 words for each filter and the new interpolator only has 1280 words for each filter.

The old rate converter computes all 80 coefficients before applying them. Therefore, it needs 80 word coefficient RAM. The new converter computes one coefficient and apples it to all of the channels before going to the next one. Therefore, it only needs one word to store the coefficient.

The impacts of the change include: the single cycle multiplier has about half area and a third current compare to the pipelined multiplier; not requiring $x^2$ and $x^3$ saves area and current too; and a lower clock rate means less current.

More filters take more area which is a tradeoff, but it makes the design more flexible and is able to handle all rate to all rate conversion. Also, the total words is 7680 words for the new design compared to 5120 words for the old one.

Not requiring the coefficient RAM makes a big difference in area and current.

Figure 8B:
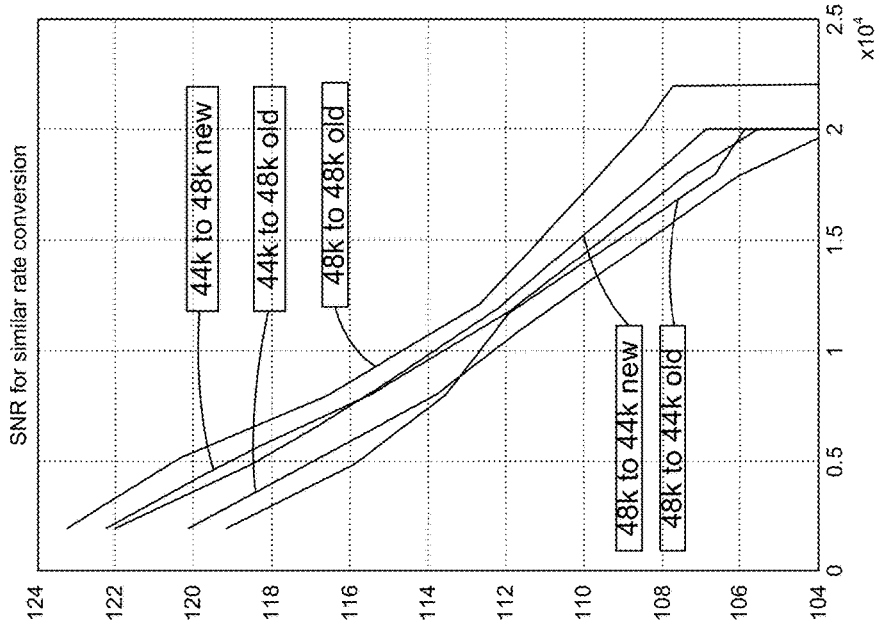
Figure 8A:
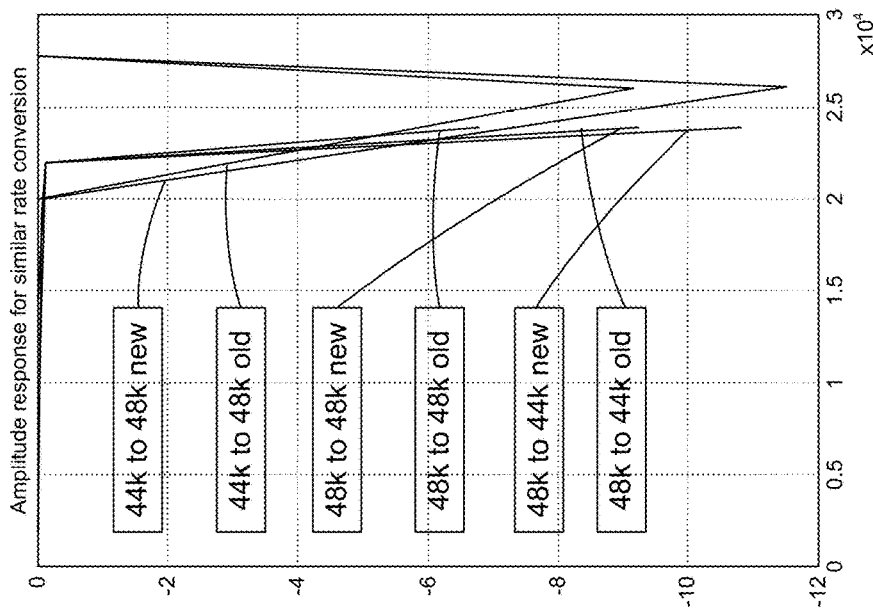

FIGS. 8A and 8B are graphs that illustrate amplitude response and SNR for similar rate conversions comparing an existing rate controller (labeled in the graphs as "old filter") to a rate controller according to embodiments of the invention (labeled in the graphs as "new filter").

Figures 9A, 9B:
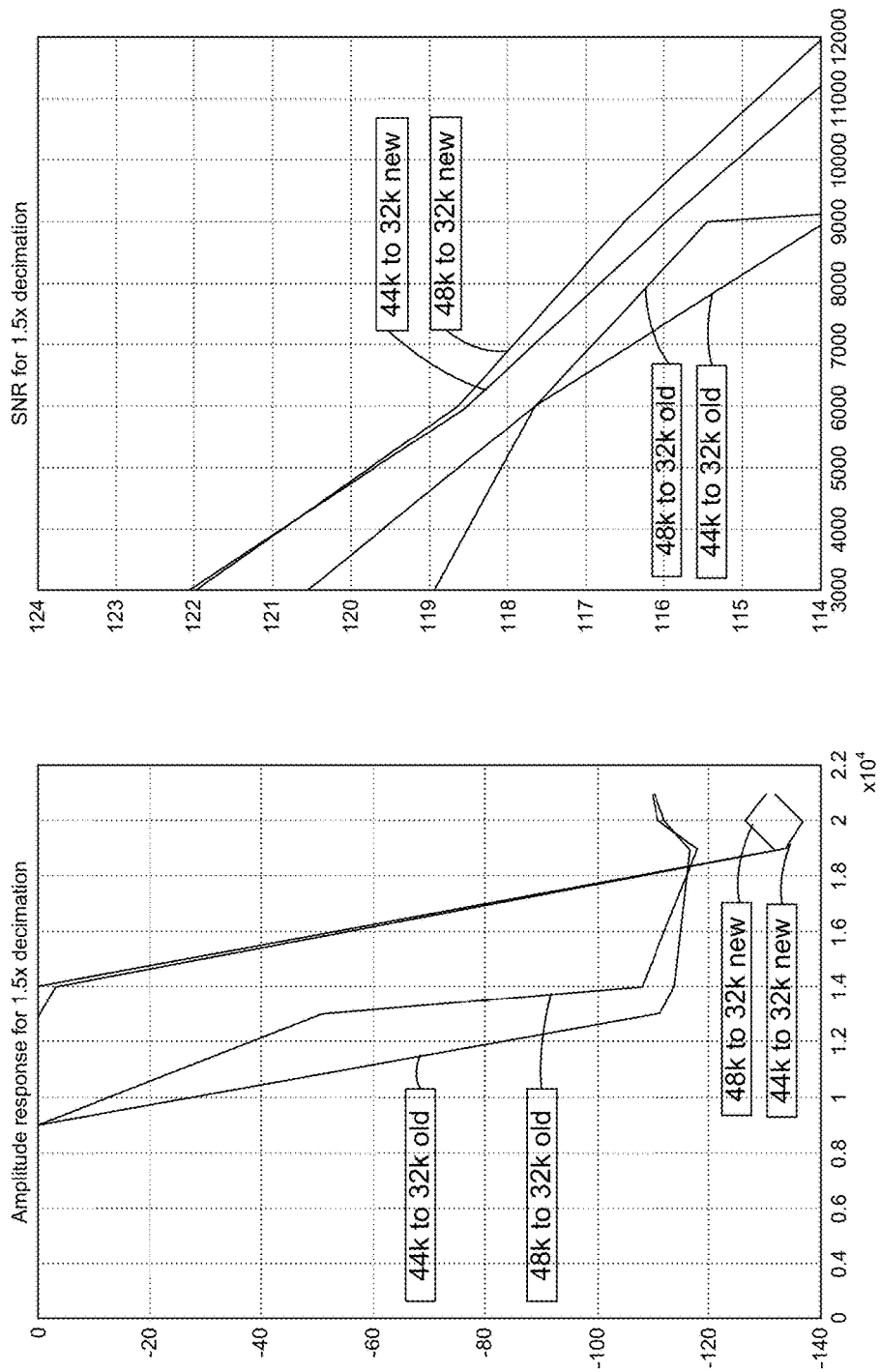

FIGS. 9A and 9B are graphs that illustrate amplitude response and SNR for 1.5× decimation comparing an existing rate controller (labeled in the graphs as "old filter") to a rate controller according to embodiments of the invention (labeled in the graphs as "new filter").

Figures 10A, 10B:
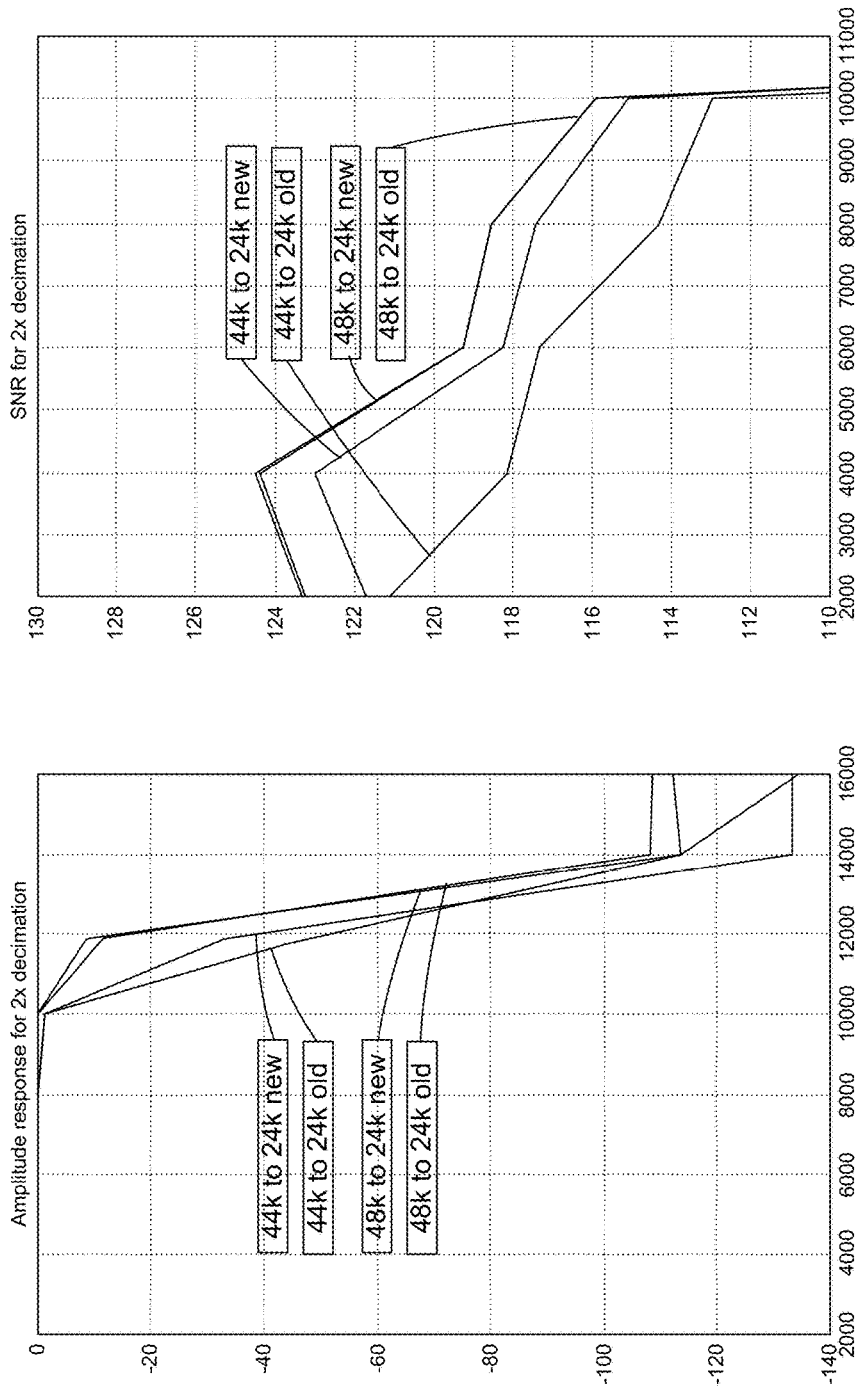

FIGS. 10A and 10B are graphs that illustrate amplitude response and SNR for 2× decimation comparing an existing rate controller (labeled in the graphs as "old filter") to a rate controller according to embodiments of the invention (labeled in the graphs as "new filter").

FIGS. 11A and 11B are graphs that illustrate amplitude response and SNR for 3× decimation comparing an existing rate controller (labeled in the graphs as "old filter") to a rate controller according to embodiments of the invention (labeled in the graphs as "new filter").

Figures 12A, 12B:
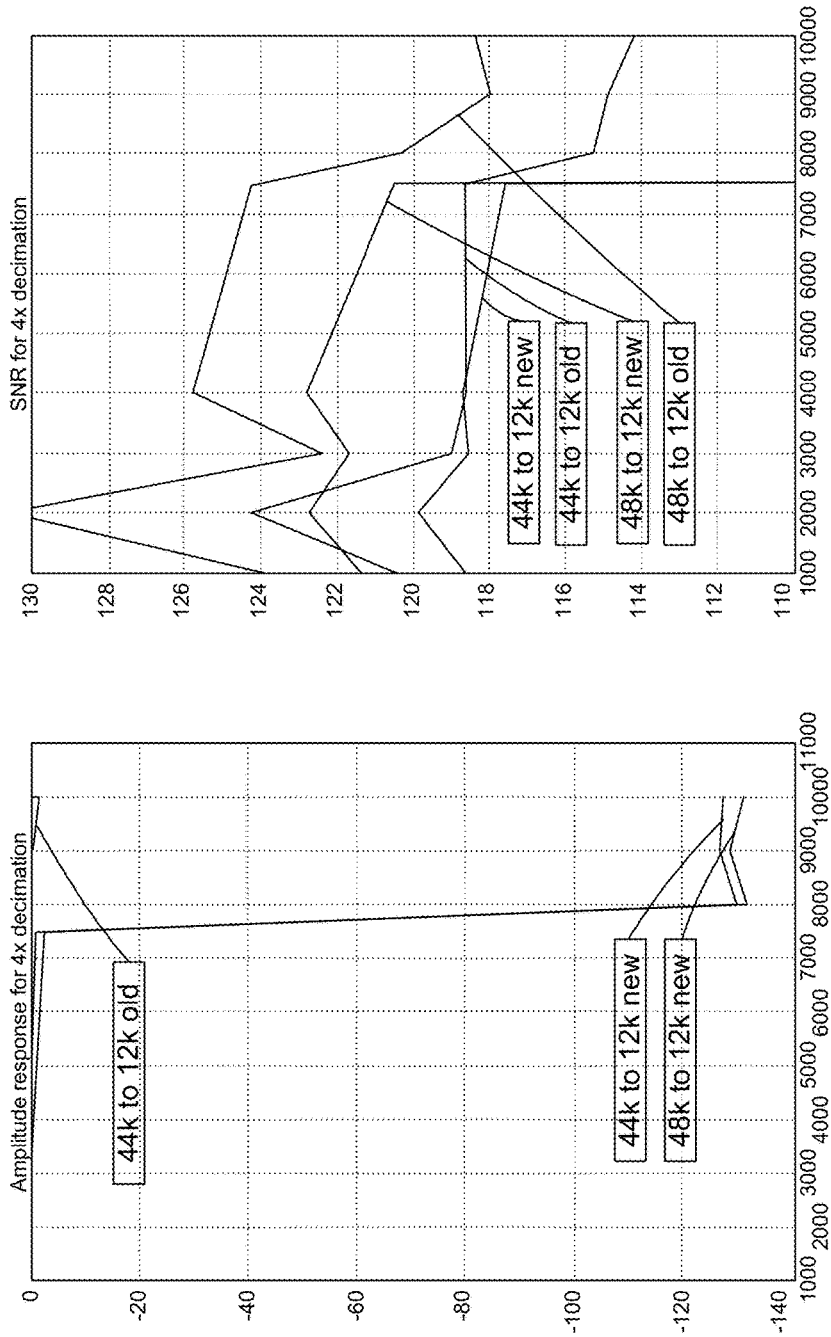

FIGS. 12A and 12B are graphs that illustrate amplitude response and SNR for 4× decimation comparing an existing rate controller (labeled in the graphs as "old filter") to a rate controller according to embodiments of the invention (labeled in the graphs as "new filter").

Figures 13A, 13B:
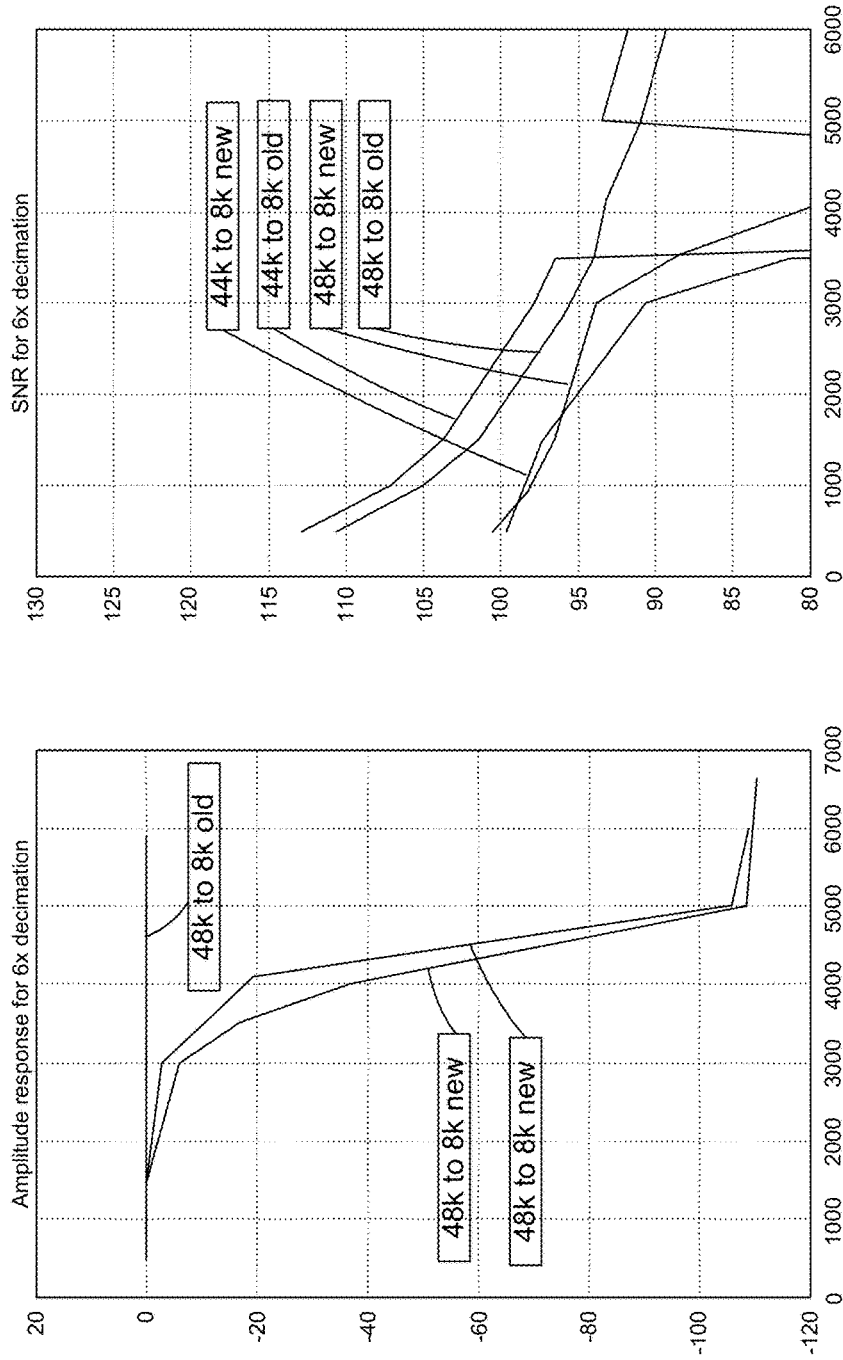

FIGS. 13A and 13B are graphs that illustrate amplitude response and SNR for 6× decimation comparing an existing rate controller (labeled in the graphs as "old filter") to a rate controller according to embodiments of the invention (labeled in the graphs as "new filter").

Figures 14A, 14B:
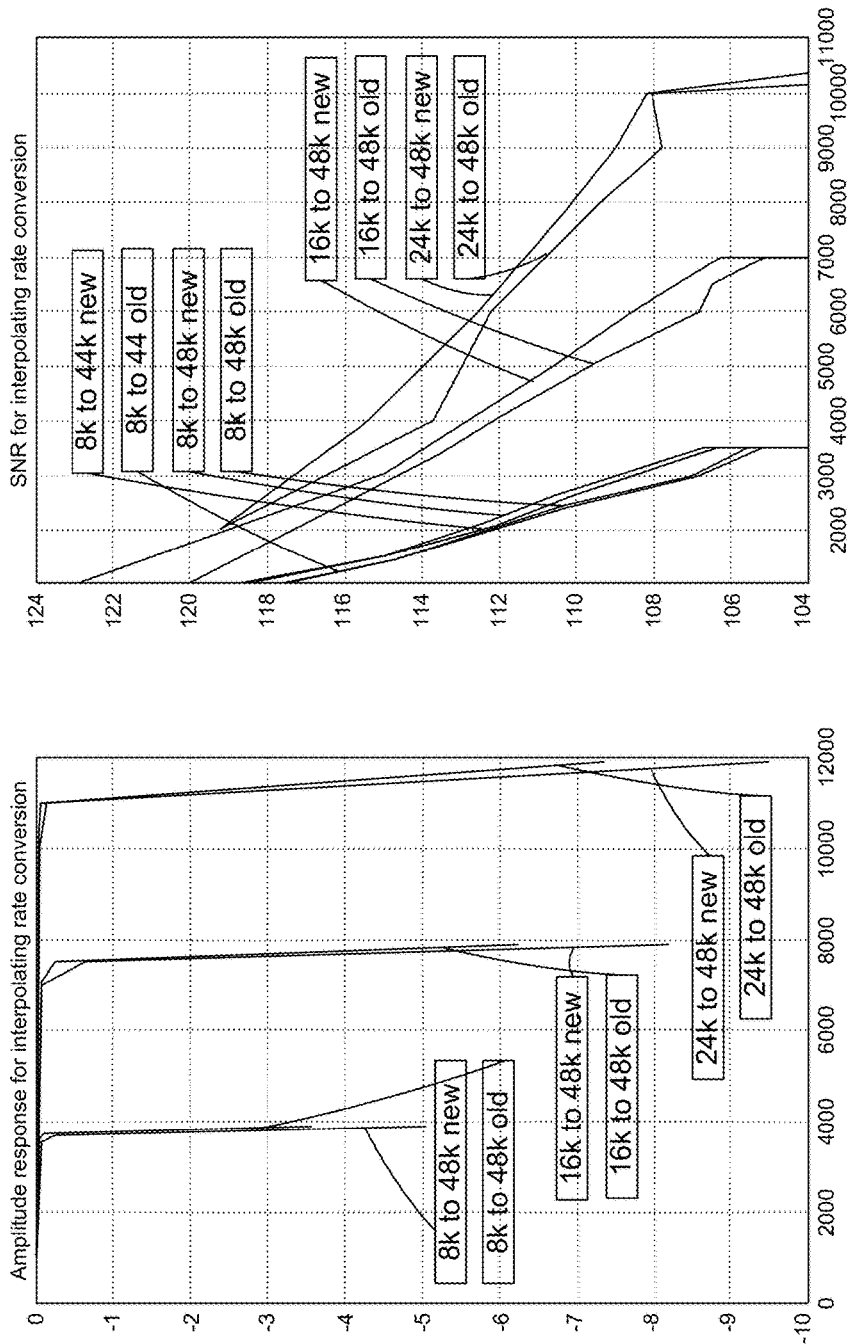

FIGS. 14A and 14B are graphs that illustrate amplitude response and SNR for interpolation rate conversion comparing an existing rate controller (labeled in the graphs as "old filter") to a rate controller according to embodiments of the invention (labeled in the graphs as "new filter").

From inspection of FIGS. 8A-14B, it is seen that, for most of the cases, a rate coder according to embodiments of the invention ha have 1~2 dB higher SNR compare to the old rate coder. The exceptions are, for 6× decimation, the new rate coder has 95 dB~100 dB SNR while the old rate coder has more than 10 dB higher SNR. This is because the new coder provides very tight alias rejection compared to the old decoder. Similarly, for 4× decimation, the new coder has about 4 dB lower SNR, which is also due to increased computation for tight alias rejection.

When the input rate is very close to integer multiple of output rate, the alias falls right on the signal. In these cases, the old and new coders have similar SNRs. That is because the alias falls almost exactly on the signal and cannot be distinguished.

Embodiments of the invention provide: up to 8 channels of audio with a sample rate <=48 KHz with a 48 MHz clock rate, and coverage of all rate to all rate conversion if the decimation rate is not more than 6×.

Embodiments of the invention may be incorporated into integrated circuits such as sound processing circuits, or other audio circuitry. In turn, the integrated circuits may be used in audio devices such as headphones, sound bars, audio docks, amplifiers, speakers, etc.

Also, although embodiments of the invention have been described using functional blocks, the block may be implemented in any physical embodiment, as is known in the art. For example blocks may be implemented in application specific integrated circuits (ASICs), FPGAs or other programmable firmware, software running on a specialized processor, software running on a general purpose processor, or any combination of the above.

Having described and illustrated the principles of the invention with reference to illustrated embodiments, it will be recognized that the illustrated embodiments may be modified in arrangement and detail without departing from such principles, and may be combined in any desired manner. And although the foregoing discussion has focused on particular embodiments, other configurations are contemplated.

In particular, even though expressions such as "according to an embodiment of the invention" or the like are used herein, these phrases are meant to generally reference embodiment possibilities, and are not intended to limit the invention to particular embodiment configurations. As used herein, these terms may reference the same or different embodiments that are combinable into other embodiments.

Consequently, in view of the wide variety of permutations to the embodiments described herein, this detailed description and accompanying material is intended to be illustrative only, and should not be taken as limiting the scope of the invention.

What is claimed is:

1. A rate converter implemented in an audio processing circuit, the rate converter comprising:
    an input for receiving audio data sampled at an input sample rate;
    a sample index accumulator for determining a sample index for each output audio sample at an output sample rate different from the input sample rate;
    an error accumulator for determining and outputting an index error;
    a phase lock tracking loop for estimating a ratio between the input sample rate and the output sample rate;
    a gain value controller configured to adjust gain values during conversion between the input sample rate and the output sample rate; and
    a filter selector structured to select a filter from a plurality of filters for application to the audio data based on output of the gain value controller.

2. The rate converter of claim 1, in which each of the plurality of filters is configured to provide a different impulse response to the audio data during rate conversion.

3. The rate converter of claim 2, in which the plurality of filters are infinite impulse response (IIR) filters.

4. The rate converter of claim 1, in which the filter selector selects a new filter when an absolute value of the index error and a change of slope of the index error are both under or both over a threshold.

5. The rate converter of claim 1, in which the filter selector selects a filter for a fixed amount of time.

6. The rate converter of claim 5, in which the plurality of filters are ordered, and in which the fixed amount of time doubles for each higher order filter.

7. The rate converter of claim 1, further comprising a sample interpolator configured to apply a continuous time filter with a predetermined frequency response to resample the audio data from the input sample rate to the output sample rate.

8. The rate converter of claim 7, in which the continuous time filter is approximated by dividing a sample period into pieces and providing a polynomial for each piece.

9. The rate converter of claim 7, in which the sample interpolator computes a single coefficient and applies the single coefficient to all channels.

10. The rate converter of claim 7, in which the sample interpolator employs a single cycle multiplier.

11. The rate converter of claim 7, in which the sample interpolator processes a plurality of samples of audio data according to filter size by:
    generating a coefficient,
    applying a multiplier, and
    adding an input sample for each audio channel.

12. The rate converter of claim 1, in which the input audio data is received as part of a plurality of input audio samples packed into one word for all audio channels.

13. The rate converter of claim 12, in which input channel identifiers (IDs) are received to indicate which audio channel each input audio sample belongs to.

14. The rate converter of claim 1, in which the rate converter is configured to receive an input sample ready signal indicating when a next sample of audio data is ready for conversion.

15. The rate converter of claim 1, in which the rate converter is configured to output a sample acknowledgement indicating that an audio destination is ready to take a new sample of audio data.

16. The rate converter of claim 1, in which the rate converter is configured to estimate a decimation rate by measuring the input sample rate and the output sample rate.

17. The rate converter of claim 16, in which the filter selector selects a filter for application to the audio data at least partially based on the decimation rate.

18. The rate converter of claim 16, further comprising a decimation rate register for storing the decimation rate.

* * * * *